United States Patent
Van Pelt et al.

(10) Patent No.: US 9,857,851 B1
(45) Date of Patent: Jan. 2, 2018

(54) TOOLLESS DATA STORAGE DEVICE CARRIER

(71) Applicant: Seagate Technology LLC, Cupertino, CA (US)

(72) Inventors: Kevin Van Pelt, Longmont, CO (US); Christopher E. Schroeder, Erie, CO (US); Charles P. Morris, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/198,380

(22) Filed: Jun. 30, 2016

(51) Int. Cl.
  *G06F 1/16* (2006.01)
  *G06F 1/18* (2006.01)
  *H05K 7/14* (2006.01)
  *H05K 7/18* (2006.01)

(52) U.S. Cl.
  CPC .............. *G06F 1/187* (2013.01); *G06F 1/183* (2013.01); *H05K 7/1401* (2013.01); *H05K 7/183* (2013.01)

(58) Field of Classification Search
  CPC .................................. G06F 1/183; G06F 1/187
  USPC ........................ 361/679.34, 679.36, 679.37
  See application file for complete search history.

(56) References Cited

U.S. PATENT DOCUMENTS

| | | | |
|---|---|---|---|
| 5,122,914 A | 6/1992 | Hanson | |
| 6,058,016 A | 5/2000 | Anderson et al. | |
| 6,097,604 A | 8/2000 | Hunter et al. | |
| 6,166,901 A | 12/2000 | Gamble et al. | |
| 6,249,432 B1 | 6/2001 | Gamble et al. | |
| 7,355,846 B1 | 4/2008 | Chen et al. | |
| 7,483,268 B1 * | 1/2009 | King, Jr. | G06F 1/187 248/682 |
| 8,215,727 B2 | 7/2012 | Barrall et al. | |
| 8,300,352 B1 | 10/2012 | Larson et al. | |
| 8,971,036 B1 * | 3/2015 | Lau | G06F 1/20 361/679.34 |
| 9,103,399 B2 * | 8/2015 | Miyakoshi | G03G 21/1619 |
| 2006/0023413 A1 * | 2/2006 | Lo | G06F 1/184 361/679.02 |
| 2008/0285225 A1 * | 11/2008 | DeMoss | G06F 1/187 361/679.34 |
| 2013/0092807 A1 * | 4/2013 | Chen | G06F 1/187 248/220.21 |
| 2014/0209548 A1 * | 7/2014 | Lo | G06F 1/187 211/59.4 |

OTHER PUBLICATIONS http://www.storagereview.com/echostreams_flachesanlld_review.

* cited by examiner

*Primary Examiner* — Nidhi Thaker
(74) *Attorney, Agent, or Firm* — Hall Estill Attorneys at Law

(57) ABSTRACT

A data storage enclosure can house and electrically connect to multiple data storage devices respectively secured by a carrier. A toolless data storage device carrier can be configured with a data storage device disposed between first and second rails and a clip physically contacting each rail while spanning the data storage device. The clip being shaped to continuously force each rail into contact with the data storage device.

19 Claims, 4 Drawing Sheets

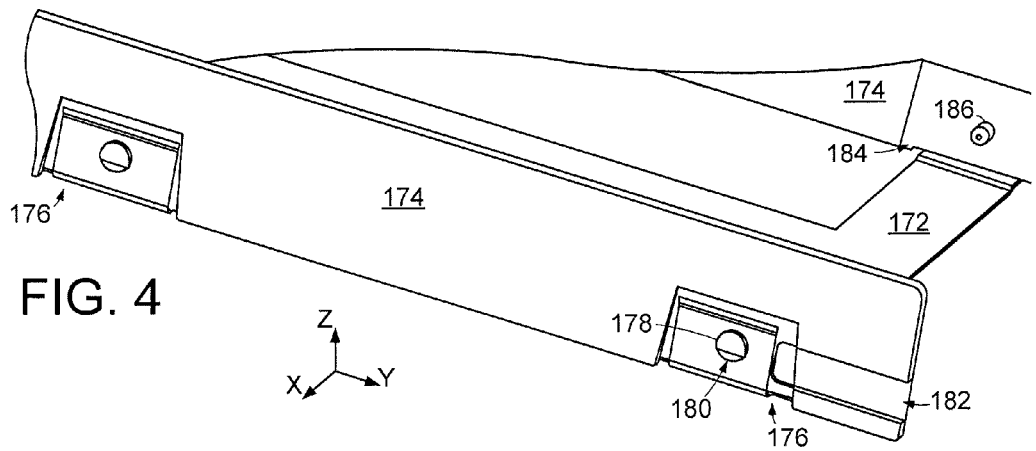
FIG. 4
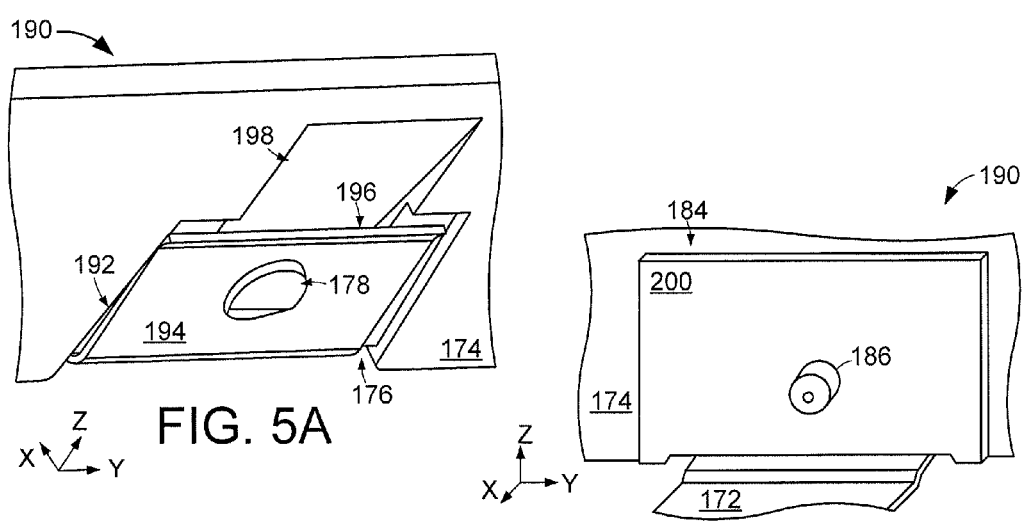
FIG. 5A
FIG. 5B
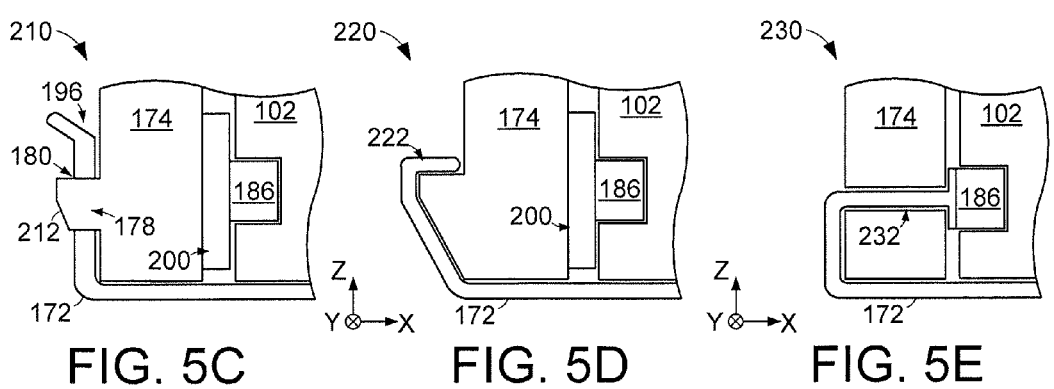
FIG. 5C
FIG. 5D
FIG. 5E

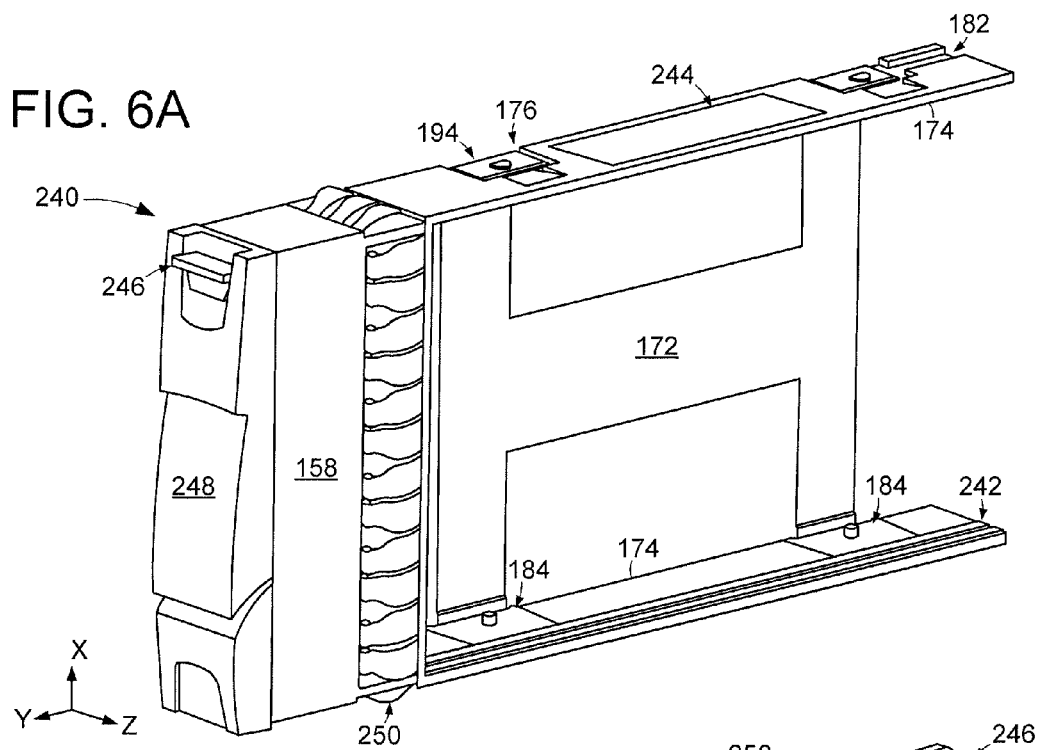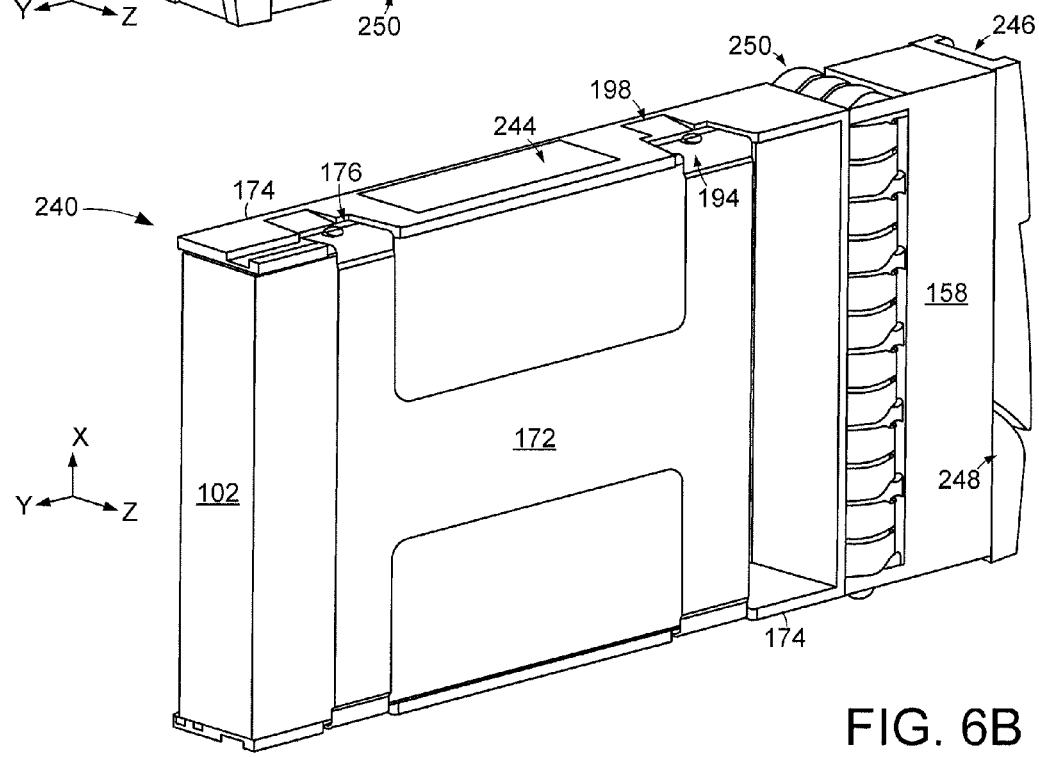

TOOLLESS DATA STORAGE DEVICE CARRIER

SUMMARY

A toolless data storage device carrier, in some embodiments, has a data storage device disposed between first and second rails and a clip physically contacting each rail while spanning the data storage device. The clip being shaped to continuously force each rail into contact with the data storage device.

BRIEF DESCRIPTION OF THE DRAWINGS

FIG. 4 illustrates a perspective view line representation of an example toolless device carrier constructed and operated in accordance with various embodiments.

FIGS. 5A-5E respectively display various portions of an example toolless device carrier configured in accordance with some embodiments.

FIGS. 6A and 6B respectively are perspective views of portions of an example toolless device carrier capable of being utilized in the data storage system of FIG. 1.

DETAILED DESCRIPTION

Various embodiments of the present disclosure are generally directed to a data storage system that employs at least one toolless device carrier to position a data storage device in a data storage enclosure.

Recently, demand for greater data capacity has sharply increased. The advent of network data storage, such as cloud computing and remote data centers, has emphasized the assembly, installation, and use of data storage devices as part of data storage enclosures that aggregate multiple data storage devices to provide large data capacity. While the incorporation of a data storage device into a data enclosure can provide interchangeable components that contribute to a collective data capacity, the physical handling and assembly of numerous data storage devices can be expensive in terms of time, parts, and risk of incorrect use. Hence, there is a need for data storage components that require less assembly and parts while reducing the risk of improper installation.

Accordingly, a data storage device carrier is configured, in some embodiments, to be toolless, which eliminates a number of fasteners from physically connecting a device carrier to a data storage device. It is noted that the term toolless is meant to denote a device carrier that physically secures a data storage device without the use of a fastener, which requires a tool for installation. A fastener is hereby meant as a separate component that joins two different elements together, such as a screw or rivet. The ability to attach and secure a data storage device to a carrier without a fastener that requires a tool to install reduces the total number of parts for a data storage enclosure, decreases carrier assembly time, and minimizes the risk of incorrect carrier installation.

Figure 1:
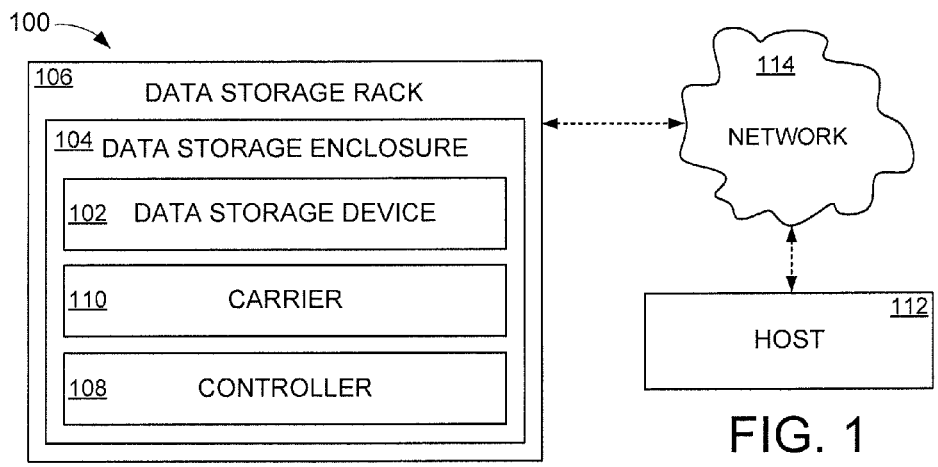
FIG. 1 is a block representation of an example data storage system arranged in accordance with various embodiments.

FIG. 1 is a block representation of an example data storage system 100 in which various embodiments of the present disclosure can be employed. The data storage system 100 can provide large data capacity via the aggregation of at least two data storage devices 102 in a data storage enclosure 104. A data storage rack 106 can comprise any number of data storage enclosures 104 that can be individually accessed in the rack 106. It is contemplated that the data storage rack 106 is a frame, or cabinet, that provides physical support for a plurality of data storage enclosures 104.

A data storage enclosure 104 can provide physical support for a plurality of data storage devices 102 as well as electrical connections that allow a local enclosure controller 108, such as a microprocessor, to access and control the flow of data into, and out of, respective data storage devices 102. Although a data storage enclosure 104 can utilize any number of local controllers 108, the enclosure 104 is arranged to provide physical support to align the respective data storage devices 102 with electrical connectors, such as a serial bus, that interconnect with the local controller(s) 108. Such physical support can be facilitated through a device carrier 110 that adapts a data storage device 102 for physical securement in the data storage enclosure 104.

While a data storage rack 106, or enclosure 104, can be used in isolation, assorted embodiments provide access to a remote host 112, such as a node or server, via a wired or wireless network 114. The remote host 112 can operate in concert with, or independent of, the local enclosure controller 108 to direct data management operations. It is contemplated that particular tasks are dictated by the remote host 112 while other tasks are carried out by the local controller 108. For example, stale data management, such as garbage collection, can be assigned only to the remote host 112 while data updating is solely conducted by the local controller 108.

Figure 2:
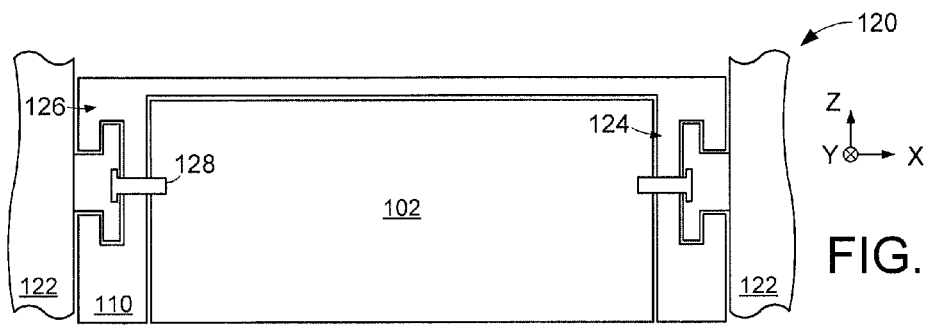
FIG. 2 shows a portion of an example data storage enclosure capable of being used in the data storage system of FIG. 1.

FIG. 2 illustrates a line representation of a portion of an example data storage enclosure 120 that can be utilized in the data storage system 100 of FIG. 1. The data storage enclosure 120 has a rigid, or semi-flexible, frame 122 that provides any number of support rails 124 to position and align a data storage device 102 with an electrical connector of the data storage enclosure 120 (not shown).

It is noted that the data storage device 102 is not limited to a particular type, size, or capacity. For example, the data storage device 102 can be a rotating media hard disk drive (HDD), a solid-state memory, or a hybrid device employing multiple different types of memory. For non-rotating data storage devices, such as solid-state drives, the support rails 124 can be relatively simple due to the light weight. However, for data storage devices 102 that utilize rotating media, vibration, shock, and physical trauma concerns cause the support rail 124 to be constructed more robustly, which corresponds with a more heavy duty structure and resistance to vibration and movement resonating and causing damage in the data storage enclosure 104.

With vibration and movement concerns in mind, the data storage device 102 is physically connected to the enclosure frame 122 via a device carrier 110 that can provide alignment features 126, adapt the device 102 for connection to the frame 122, and mitigate the effects of device 102 movement. Regardless of the form factor of the data storage device 102, such as 3.5" or 2.5", the carrier 110 is physically secured to the device 102 via mechanical fasteners 128. The installation and tightening of the mechanical fasteners 128 ensure the device 102 is secure and the electrical connection between the device and the enclosure controller remains uninterrupted despite vibration of the data storage device 102 and/or movement of the data storage enclosure 120 as a whole.

Figure 3:
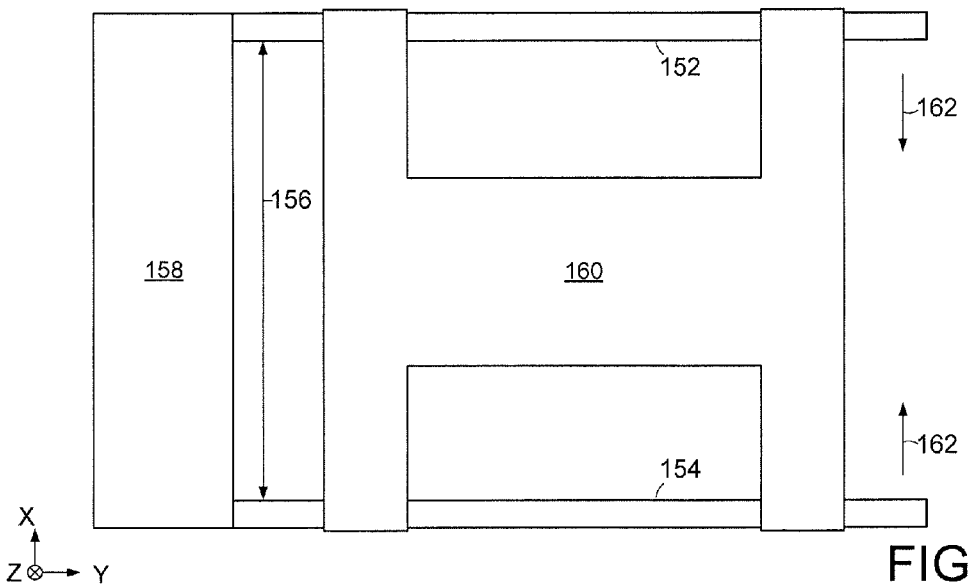
FIG. 3 depicts a line representation of a portion of an example toolless device carrier that may be employed in the data storage system of FIG. 1.

FIG. 3 represents an example toolless carrier 150 that can be employed in a data storage system in accordance with various embodiments. The toolless carrier 150 has first 152 and second 154 rails that are positioned a predetermined width 156 apart, along the X axis, to accommodate a data storage device. The respective rails 152 and 154 can be constructed of one or more rigid, flexible, or semi-rigid materials, which allows vibrations and device movement to be efficiently dissipated.

In some embodiments, each rail 152 and 154 is attached to a latch mechanism 158 that can secure the position of the rails within a data storage enclosure. Regardless of the size, assembly, position, and operation of the latch mechanism 158, the rails 152 and 154 will loosely contact opposite sides of a data storage device due to the cantilevered extension from the latch assembly 158. Hence, one or more clips 160 can continuously extend across and connect to the respective rails 152 and 154 so that no other tool, such as a spring, is needed to connect the rails 152 and 154. The clip 160, which can generally be characterized as a securing feature, can provide continuous spring pressure inward, as shown by arrows 162, which can secure physical attachment of each rail 152 and 154 to different sides of a data storage device.

It is noted that although a single clip 160 is shown in FIG. 3, such configuration is not required or limiting. For example, multiple different clips 160 can concurrently extend across the rails 152 and 154 to provide different spring forces. That is, different clips 160 may be made of different materials and/or may have different thicknesses, shapes, sizes, and positions to apply a variety of different spring pressures onto a data storage device. The ability to tune the clip 160 to provide diverse spring forces can optimize the mitigation of vibration, movement, and shock in a physically connected data storage device. The customization of the clip 160 can further eliminate the use of mechanical fasteners, such as fastener 128, to secure the rails 152 and 154 to the data storage device.

FIG. 4 illustrates a perspective line representation of a portion of an example toolless carrier 170 that can be employed in a data storage enclosure in accordance with various embodiments. The toolless carrier 170 has a spring clip 172 that contacts a rail 174 at separate locations along the Y axis and applies force inward along the X axis.

While the spring clip 172 may temporarily, or permanently, attach to the rail 174 in an unlimited variety of manners, assorted embodiments arrange the rail 174 and clip 172 to fit in recesses 176 around securing protrusions 178 to reliably position the clip 172 and apply pressure on the rail 174. It is noted that at least a portion of the clip 172 is flexible to allow a securing aperture 180 to temporarily bend and fit around the securing protrusion 178 without degrading the spring force applied by the clip 172 onto the rail 174. The rail 174 may further be configured with at least one alignment groove 182 that can partially, or completely contact an alignment feature of a data storage enclosure, such as feature 126. It is contemplated that the alignment groove 182 can continuously extend along the entire length of the rail 174, along the Y axis, but such configuration is not limiting.

The perspective view of FIG. 4 shows a portion of a capture feature 184 that is shaped to physically contact a data storage device. Each rail 174 can have one or more capture features 184 that can have matching, or dissimilar, shapes, sizes, materials, and means for securing to a data storage device. As shown, the capture feature 184 is aligned with the recess 176 and securing protrusion 178 along the X axis, which can efficiently transfer spring force from the securing protrusion 178 to the capture protrusion 186 of the capture feature 184.

FIGS. 5A-5E respectively display assorted portions of an example toolless carrier 190 that can secure a data storage device in accordance with some embodiments. In FIG. 5A, a perspective view of a securing feature 192 illustrates how a clip tab 194 fits around the securing protrusion 178 of the recess 176 to apply force along the X axis.

The clip tab 194 has an angled section 196 that operates in concert with a removal notch 198 to allow for each installation and removal of the clip tab 194. That is, the angled tab section 196 is oriented away from the recess 176 to allow the clip tab 194 to easily slide over, and into securement with, the recess protrusion 178. The angled tab section 196 further allows easily access and manipulation of the clip tab 194 for removal due to the notch 198 that reduces the thickness of the rail 174. It is noted that the rail recess 176 is shaped to match the clip tab 194, which provides efficient installation compared to if the protrusion 178 was present outside of a region of reduced rail thickness.

An example capture feature 184 is displayed in FIG. 5B. The capture feature 184 has a pad 200 that protrudes from the support rail 174 to present the capture protrusion 186. The pad 200 may have a uniform, or varying, thickness, as measured along the X axis, to ease engagement and securement of the capture protrusion 186 into a data storage device. It is contemplated, but not required, that the capture protrusion 186 is shaped to fit snugly in an aperture of a data storage device. As such, the capture protrusion 186 can be any shape, such as rectangular or hexagonal, and have one or more threads, ridges, spines, or notches to facilitate secure physical connection between the rail 174 and the data storage device.

In some embodiments, the capture protrusion 186 is configured to plastically deform in an aperture of a data storage device in response to the spring pressure applied by the clip 172. As such, the capture protrusion 186 can be constructed of a different material than the support rail 174. However, it is noted that the capture protrusion can alternatively be rigid and non-deforming in response to the clip's spring force. The ability to customize the configuration of the securing feature 184 allows the spring force applied by the clip 172 to be catered to the expected amount of vibration and movement in a data storage device. For instance, the capture protrusion 186 can be tuned to deform to permit very little data storage device movement for a solid-state, or hybrid, drive that will experience little rotational vibration while use of a HDD with lots of vibration can correspond with a capture protrusion 186 that mitigates vibration.

While a spring clip 172 is not limited to a particular configuration, FIGS. 5C-5E respectively illustrate non-limiting cross-sectional line representations of how a clip 174 can be attached to a support rail 174. Assembly 210 mirrors the clip 172 configuration shown in FIGS. 5-6B where the securing protrusion 178 extends through the securing aperture 180. The securing protrusion 178 is shaped with an angled installation surface 212 that efficiently allows the angled clip section 196 to slide over the protrusion 178 and into full engagement with the support rail 174, as shown.

FIG. 5D depicts clip assembly 220 how the clip 172 can fit around the securing protrusion 178 without a securing aperture 180. The use of a retaining clip section 222 that is parallel to the X axis instead of a securing aperture 180 can be more secure and provide greater spring force to the support rail 174 than the arrangement of assembly 210. It is noted that a securing protrusion 178 is not required to secure the clip 172.

The assembly 230 of FIG. 5E shows how the clip 172 can continuously extend through a retention aperture 232 in the support rail 174. It is contemplated that the clip can present the capture protrusion 186, but such arrangement is not required. While extending the clip 172 through the support rail 174 may provide heightened securement for the clip 172, it is noted that only one support rail 174 can employ such a configuration and have the clip 172 be replaceable. That is, one side of the clip 172 can be secured to a first support rail 174 with the arrangement of assembly 230 and secured to a second support rail 174 with a different configuration to allow the clip 172 to be removed and replaced.

FIGS. 6A and 6B respectively display various portions of an example toolless device carrier 240 that is constructed and utilized in accordance with assorted embodiments. The toolless device carrier 240 has separate support rails 174 each cantilevered from a latch mechanism 158. FIG. 6A shows how the data storage device contacting side of a support rail 174 can have one or more dampening inserts 242 that mitigates data storage device rotation, movement, and vibration. In some embodiments, multiple dampening inserts 242 can be utilized in each support rail 174 with different sizes, shapes, positions, and/or materials.

As a non-limiting example, a rubber material can be employed by a first dampening insert 242 while an elastomer is used for a second dampening insert 242 in the same support rail 174. The ability to utilize different dampening materials with different configurations allows each support rail 174 to provide secure physical attachment in addition to reduced data storage enclosure vibrational trauma. It is contemplated that a resonance feature 244 may also be positioned on a support rail 174. A resonance feature 244 can be a film or component attached to an exterior portion of the support rail 174, opposite an interior portion that contacts a data storage device 102, to modify the reaction of the support rail 174 to encountered movement. As such, the resonance feature 244 can strengthen and alter the resonance frequency of the support rail 174 to ensure damage does not result from device operation.

Regardless of the inclusion and configuration of a dampening insert 242 or resonance feature 244, the latch mechanism 158 can allow for efficient and reliable installation and removal of a data storage device 102. The latch mechanism 158 may comprise any number of components that may independently, or collectively, move to allow, or prevent the support rails 174 to slide into, or out of, a data storage enclosure. The non-limiting embodiment of FIGS. 6A and 6B show how the latch mechanism 158 can have a release button 246 that secures a lever 248 in place. Movement of the lever 248 can provide a positive stop for the data storage device 102 to prevent inadvertent physical trauma during installation.

The lever 248 can be complemented by a spring array 250 that can comprise one or more separate, or interconnected, springs that push outward to engage portions of a data storage enclosure. Such spring array 250 contact with the data storage enclosure can further isolate data storage device vibration and movement while adding a level of physical securement for the toolless device carrier 240.

It is noted that the toolless device carrier 240 does not have a data storage device 102 installed between the support rails. However, FIG. 6B has a data storage device 102 spanning the support rails 174 and engaged by the capture features 184 of each support rail 174. While physical contact with the capture features 184 may be sufficient to maintain the position of the data storage device 102, installation of the clip 172 in contact with, and providing force inward to, each support rail 174 ensures that the data storage device 102 is locked in place regardless of the orientation of the toolless device carrier 240 in a data storage enclosure, such as a vertical orientation where the weight of the data storage device 102 acts perpendicular to the spring force applied by the clip 172.

While a permanently attached spring clip can be incorporated into the toolless device carrier 240, the ability to remove and replace the clip 172 provides structural and operational diversity that can accommodate a variety of different data storage environments. The modular capabilities of the clip 172 is provided by the securing recess 176 and protrusion 178 in cooperation with the shape of the clip tabs 194. As a result, the clip 172 can be selectively removed and installed, which can ease positioning the data storage device 102 between the support rails 174 and allow for different clips 172 to be utilized depending on the data storage environment, such as the form factor, type, and operating speed.

Figure 7:
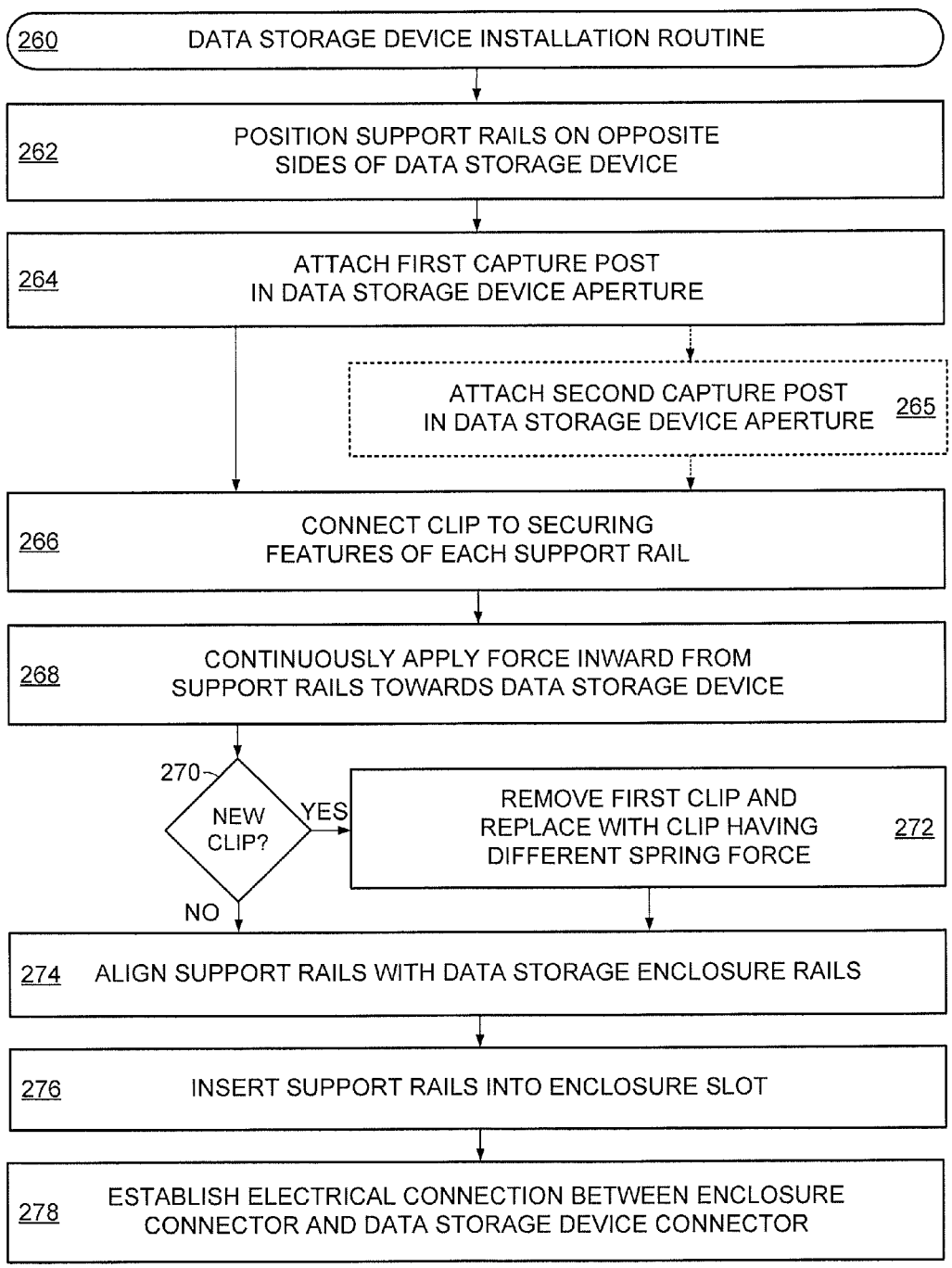
FIG. 7 provides a flowchart for an example toolless device installation routine performed in accordance with various embodiments.

A toolless device carrier 240 can be employed in a data storage enclosure in a variety of different manners. FIG. 7 conveys an example data storage device installation routine 260 that utilizes a toolless device carrier in accordance with some embodiments. Initially, a data storage device is positioned between support rails in step 262. It is noted that support rails may be loose, unassembled, or flexible prior to step 264 physically attaching a capture post of a first support rail in an aperture of the data storage device prior to optional step 265 attaching a second capture post into the data storage device. As previously noted, the capture post may move and/or deform in response to installation in the data storage device aperture.

With the support rails physically connected to the data storage device, step 266 installs at least one clip to each support rail to continuously apply force inward towards the data storage device in step 268. The installation of the clip(s) in step 266 can entail positioning a securing aperture of the clip around a securing protrusion of the support rail. In some embodiments, decision 270 evaluates if the first clip connected in step 266 is to be replaced. If so, step 272 proceeds to remove and replace the first clip with a second clip that has a second spring force that is different from the first spring force.

After the replacement of the first clip, or if no new clip is chosen in decision 270, the presence of a clip spanning the data storage device and contacting the respective support rails provides a singular unit that is then aligned with rails of a data storage enclosure in step 274. Engagement of the support rails with the enclosure rails can restrict movement of the toolless device carrier to a particular enclosure slot. That is, step 274 can align an electrical connector of the data storage device with an enclosure electrical connector.

Insertion of the support rails into the enclosure slot in step 276 causes the aligned electrical connectors to physically mate and establish an electrical connection in step 278. The use of the clip to continuously apply spring force onto the support rails allows steps 276 and 278 to occur without concern for data storage device movement, which could result in device misalignment in the enclosure slot and an unreliable electrical connection in step 278.

Through the various embodiments of a toolless device carrier, a data storage device can be securely retained without the use of separate mechanical fasteners. The utilization of removable clips that are customized to a data storage environment ensures that a data storage device is locked in place so that connection with a data storage enclosure can be done reliably. With the ability to position one or more dampening and resonance features on a support rail, the spring force applied to a data storage device by the clip can act to mitigate device vibration and rotation, which optimizes performance of the data storage device alone as well as part of a collective data storage enclosure.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. A system comprising: a data storage device disposed between first and second rails, each rail comprising a securing protrusion extending from a first side and a capture protrusion extending from a second side, the first and second sides being opposite; and a clip physically contacting the securing protrusion of each rail and covering a bottom surface of the data storage device, the clip shaped to continuously force the capture protrusion of each rail into contact with different respective apertures of the data storage device; wherein a securing aperture of the clip fits around the securing protrusion of each of the rails.

2. The system of claim 1, wherein the first rail has a dampening insert contacting the data storage device, the dampening insert continuously extending along a longitudinal length of the first rail.

3. The system of claim 2, wherein the damping feature comprises a different material than the first rail.

4. The system of claim 1, wherein the second rail has separate first and second dampening inserts each contacting the data storage device, the second dampening insert positioned between the second rail and the capture protrusion.

5. The system of claim 4, wherein the first dampening insert comprises a first material and the second dampening insert comprises a second material, the first and second materials being different.

6. The system of claim 1, wherein the clip contacts multiple separate securing regions of each rail.

7. The system of claim 6, wherein each securing region is defined by a recess in a rail surrounding the securing protrusion.

8. The system of claim 6, wherein at least one securing region has an access surface defined by a reduced thickness in a rail.

9. The system of claim 8, wherein the clip has a tab positioned proximal to and extending away from the access surface at an angle.

10. An apparatus comprising a data storage device disposed between first and second rails, each rail having at least one capture protrusion extending into an aperture of the data storage device, a clip physically contacting and fitting around a securing protrusion of each rail and covering a bottom surface of the data storage device, the clip shaped to continuously force each capture protrusion into the aperture of the data storage device, each securing protrusion facing away from the rail and the data storage device and having an installation surface angled away from the rail.

11. The apparatus of claim 10, wherein at least one capture protrusion comprises a different material than either rail.

12. The apparatus of claim 10, wherein each rail has multiple separate capture protrusions.

13. The apparatus of claim 10, wherein the at least one capture protrusion is positioned on a pad of the first rail, the pad being a protrusion from the first rail.

14. The apparatus of claim 10, wherein the at least one capture protrusion is aligned with the securing protrusion of the first rail.

15. The apparatus of claim 10, wherein each rail is cantilevered from a latch mechanism.

16. A method comprising: positioning a data storage device between first and second rails, each rail comprising a securing protrusion extending from a first side and a capture protrusion extending from a second side, the first and second sides being opposite; contacting the securing protrusion of each rail with a first clip, the first clip covering a bottom surface of the data storage device; and forcing the capture protrusion of each rail into contact with different respective apertures of the data storage device with the first clip.

17. The method of claim 16, wherein the capture protrusion of each rail is inserted into the respective aperture of the data storage device.

18. The method of claim 16, wherein each rail slidingly contacts an enclosure slot to align an electrical connector of the data storage device with an electrical connector of a data storage enclosure.

19. The method of claim 16, wherein the first clip is replaced with a second clip, the first clip applying a different spring force onto the respective rails than the second clip.

* * * * *